(12) United States Patent
Wehage (10) Patent No.: US 6,941,495 B2
(45) Date of Patent: Sep. 6, 2005

(54) LOW COST BUILT-IN SELF TEST STATE MACHINE FOR GENERAL PURPOSE RAM TESTING

(75) Inventor: Eric R. Wehage, Tenino, WA (US)

(73) Assignee: Intel Corporation, Santa Clara, CA (US)

( * ) Notice: Subject to any disclaimer, the term of this patent is extended or adjusted under 35 U.S.C. 154(b) by 510 days.

(21) Appl. No.: 10/078,065

(22) Filed: Feb. 15, 2002

(65) Prior Publication Data

US 2003/0159095 A1 Aug. 21, 2003

(51) Int. Cl.[7] .................................................. G11C 29/00
(52) U.S. Cl. ........................ 714/718; 714/30; 365/201; 326/46
(58) Field of Search ................................ 714/733, 718, 714/738, 725, 30, 226, 732; 365/201; 326/46

(56) References Cited

U.S. PATENT DOCUMENTS

| | | | | |
|---|---|---|---|---|
| 5,825,785 A | * | 10/1998 | Barry et al. ................. | 714/732 |
| 6,415,403 B1 | * | 7/2002 | Huang et al. ............... | 714/726 |
| 6,425,103 B1 | * | 7/2002 | Phan .......................... | 714/733 |
| 6,651,201 B1 | * | 11/2003 | Adams et al. ............... | 714/733 |
| 6,675,329 B1 | * | 1/2004 | Im .............................. | 714/718 |
| 6,760,865 B2 | * | 7/2004 | Ledford et al. ............... | 714/30 |

OTHER PUBLICATIONS

V.D. Agrawal et al., "An Architecture for Synthesis of Testable Finite State Machines", Mar. 12–15, 1990, EDAC Conference 1990, pp 612–616.*

* cited by examiner

*Primary Examiner*—Albert Decady
*Assistant Examiner*—John P Trimmings
(74) *Attorney, Agent, or Firm*—Blakely, Sokoloff, Taylor & Zafman LLP (57) ABSTRACT

A system and method for creating a built-in self-testing (BIST) state machine to test random access memories (RAMs) are disclosed. The BIST state machine can be simplified to a simple four-state state machine while accommodating a large group of test suites by programming each state to have the capability of performing one of four necessary operations. These operations include a write operation, a read operation, a read/write operation and a null operation. Further bits and signals can be added to the state machine to enable an even larger array of test suites to be performed.

20 Claims, 14 Drawing Sheets

LOW COST BUILT-IN SELF TEST STATE MACHINE FOR GENERAL PURPOSE RAM TESTING

FIELD OF THE INVENTION

The field of the invention relates to integrated circuit component testing. More specifically, it relates to built-in self-testing state machines for random access memory.

BACKGROUND OF THE INVENTION

Built-in self-testing (BIST) state machines are effective for testing a variety of integrated circuit (IC) components. BIST state machines for random access memories (RAMs) embedded with in an IC are created with a high degree of flexibility using a small silicon area. BIST state machines perform a variety of test suites. Test suites often include a wide array of industry standard tests, such as Scan, Mats+, MarchC, Partial MovI, and Hammer 10 tests. These tests each have unique features to find failures in memory cells, such as stuck-at faults, bridging, opens, excessive leakage, bit-line coupling, and address decoder faults.

Figure 1A:
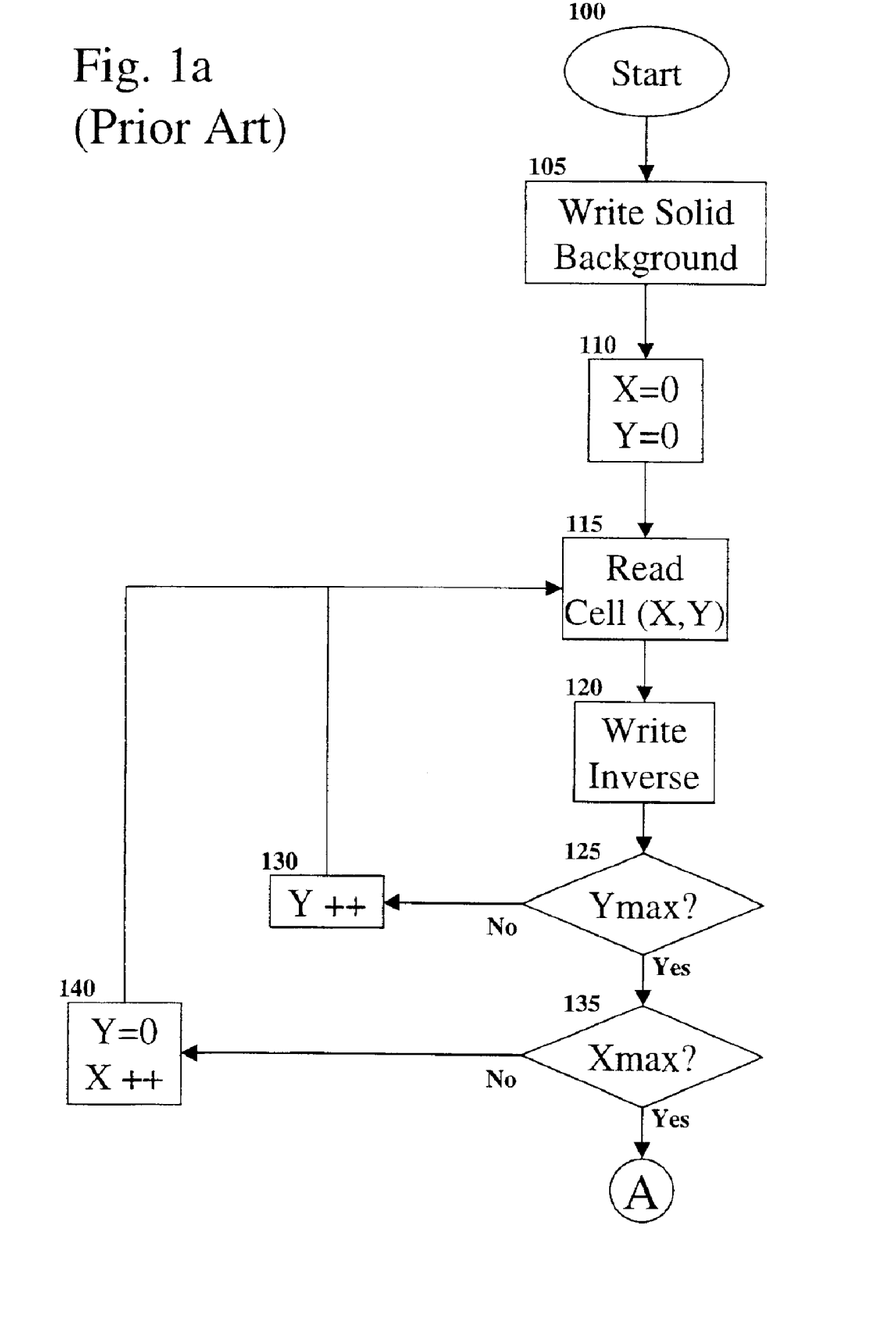
FIGS. 1a–b are a flowchart describing the Mats++ RAM test.
Figure 1B:
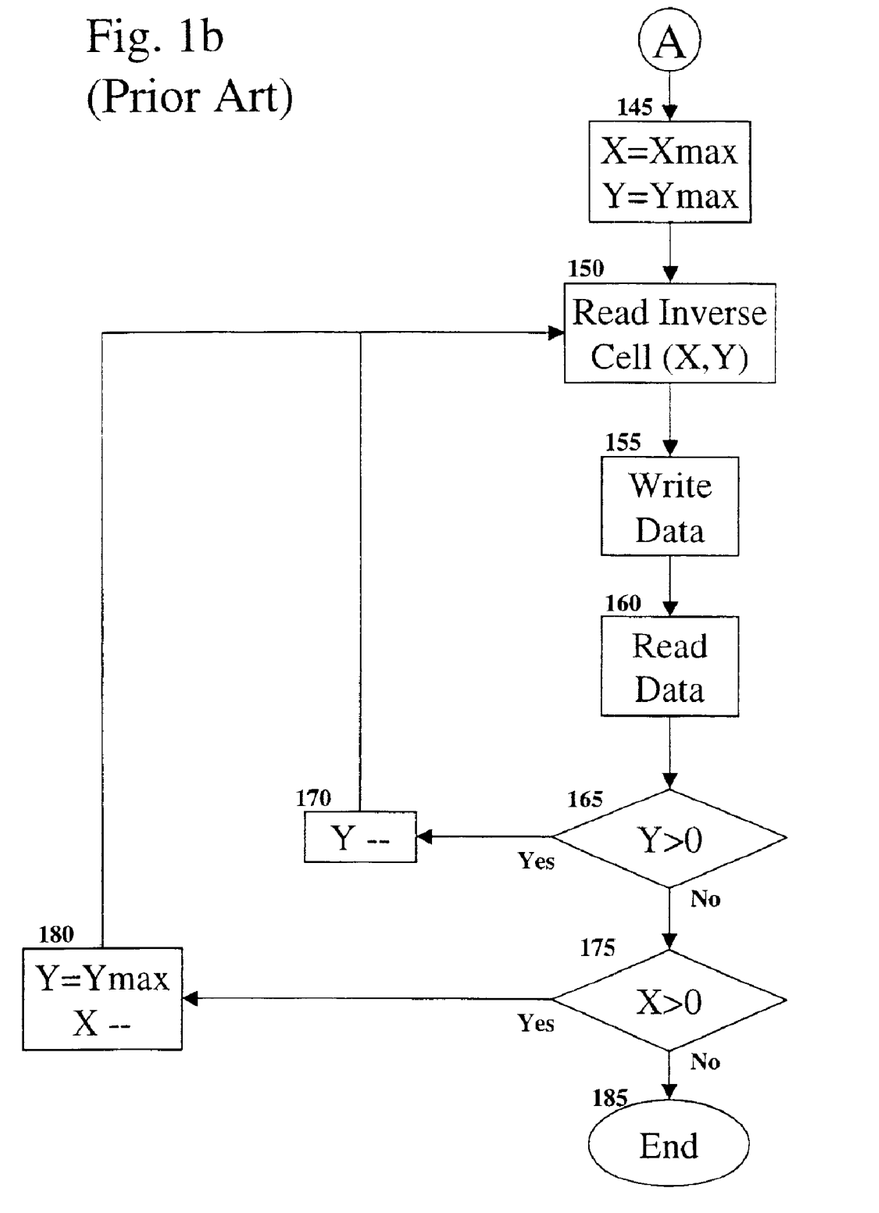

Currently, BIST state machines use nineteen state machines to conduct a limited number of tests. Each state is limited to one operation. For example, one test that is commonly performed is a test called Mats++, illustrated in the flowchart of FIGS. 1a–b. Mats++ is a test useful in detecting stuck-at faults and address decode faults. Each memory is divided into cells, containing an array of addresses. As shown in FIG. 1a, the Mats++ begins (Block 100) by writing a solid background of data to the cell being tested (Block 105). In one embodiment, a solid background of data is written by setting each bit at the address to 0. The address block is set to the beginning X and Y coordinates, or (0,0), of the cell (Block 110). A read operation (Block 115) and an inverse write operation (Block 120) are performed as the address coordinates are incremented (Blocks 130 and 140) until the maximum coordinates in the address block are reached (as tested by Blocks 125 and 135). As illustrated in FIG. 1b, the address coordinates are then set at the maximum for both the X and Y coordinates (Block 145). An inverse read operation (Block 150), write operation (Block 155), and read operation (Block 160) are performed as the address coordinates are decremented (Blocks 170 and 180) until the maximum coordinates in the cell are reached, then the test is completed (Block 185).

Figure 2:
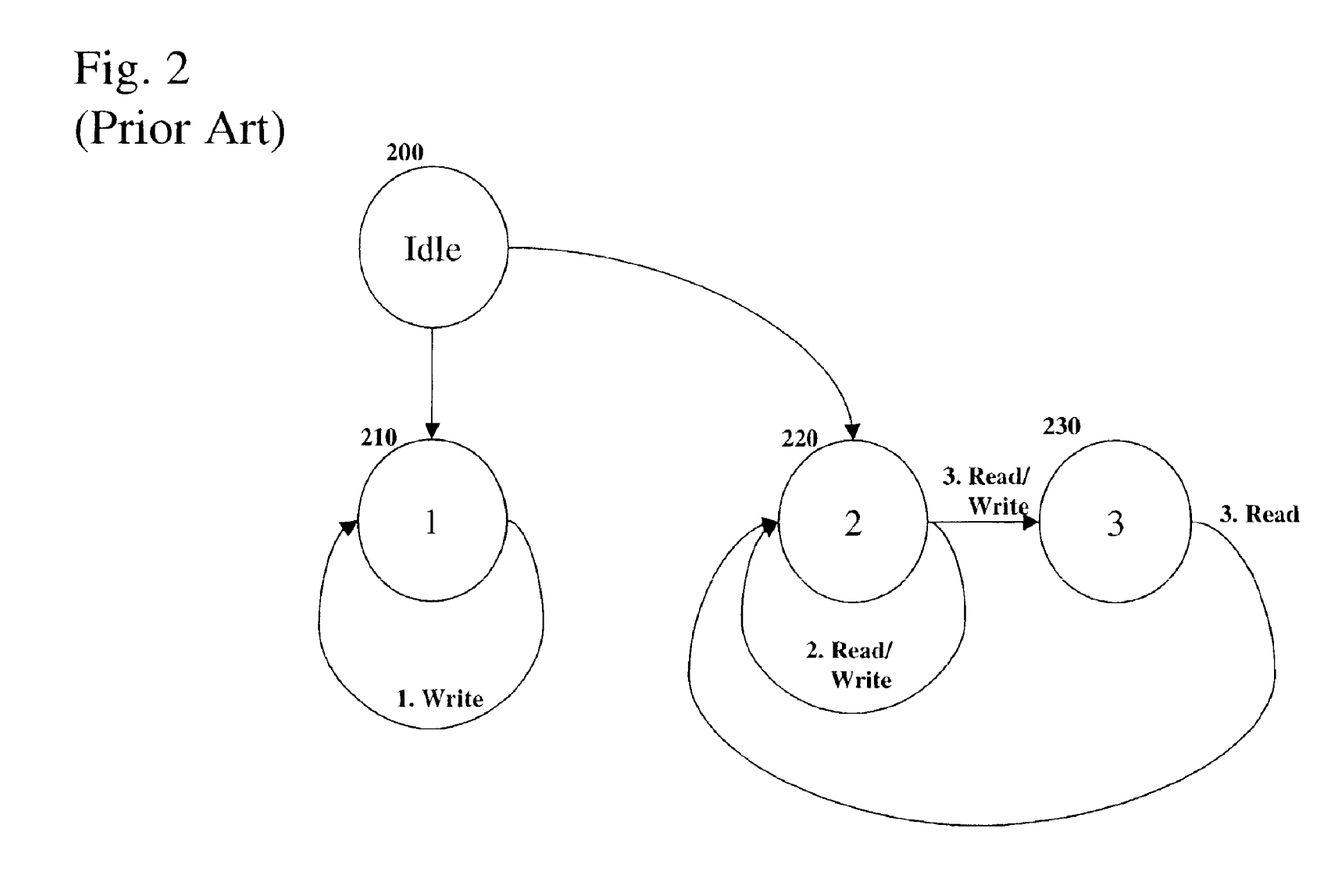
FIG. 2 is a block diagram of a state machine used to run the Mats++ RAM test.

A state machine, such as the one shown in the diagram of FIG. 2, can be used to implement the Mats++ test. The state machine includes an idle state (200) to which the state machine returns between test cycles and while tests are not being run. For the initial cycle in which a solid background is written, a first state (210) performs a looping write operation. With each write operation, the address is incremented until the entire memory cell has data written into it. For the second cycle, a second state (220) performs a looping read/write operation, in which data is read from an address, and then the inverse of that data is written back to the address. Again, the address is incremented after each cycle. For the third cycle, the second state (220) performs a read/write operation and then transitions to a third state (230) that performs a read operation. As the processing transitions back to the second state (220), the address is decremented back to the initial address.

Figure 3A:
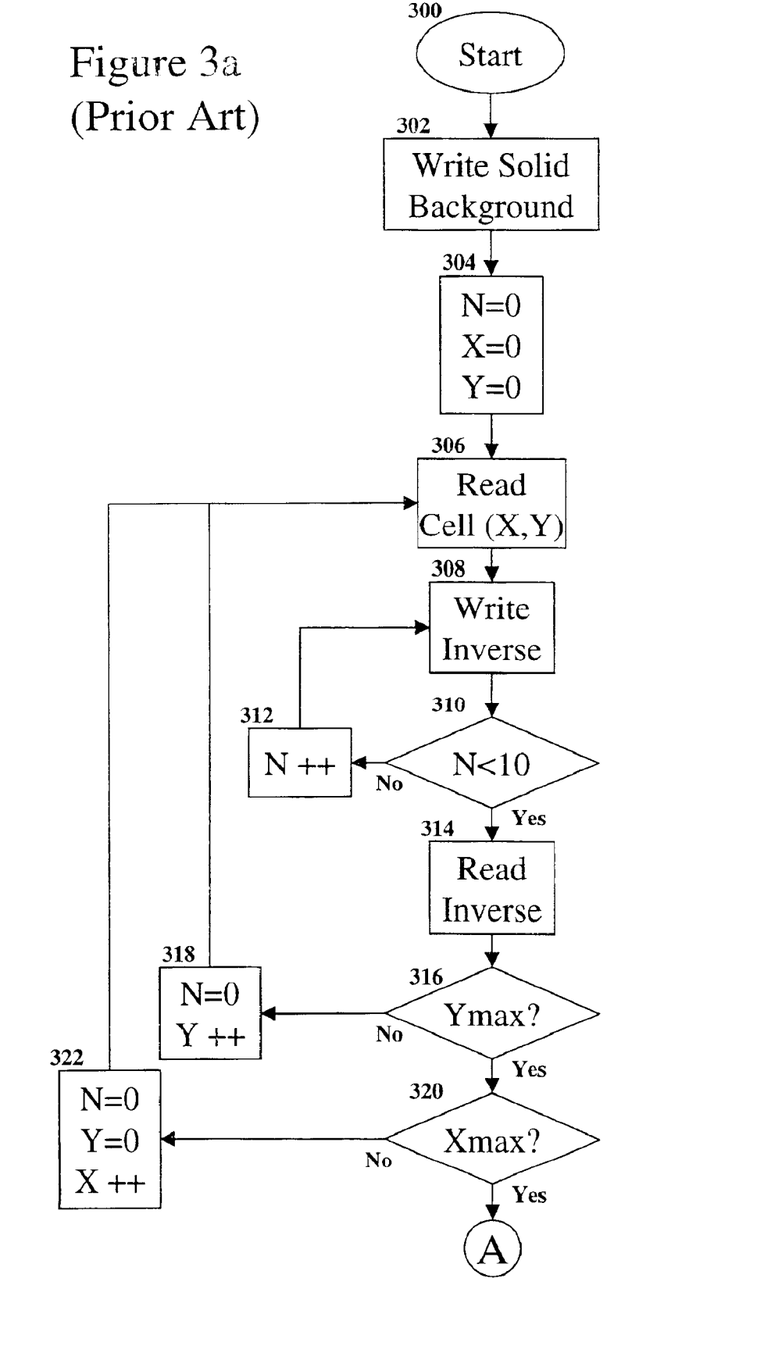
FIGS. 3a–d are a flowchart describing the Hammer 10 RAM test.
Figure 3B:
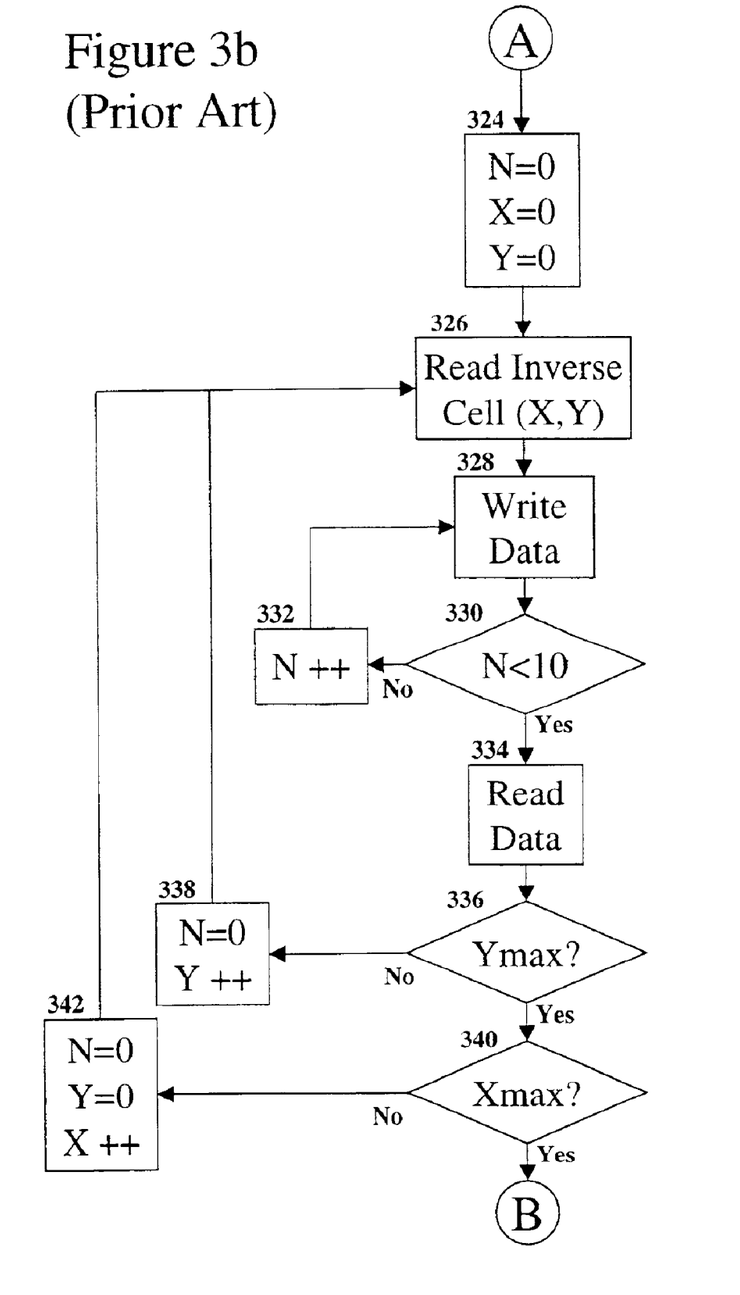
Figure 3C:
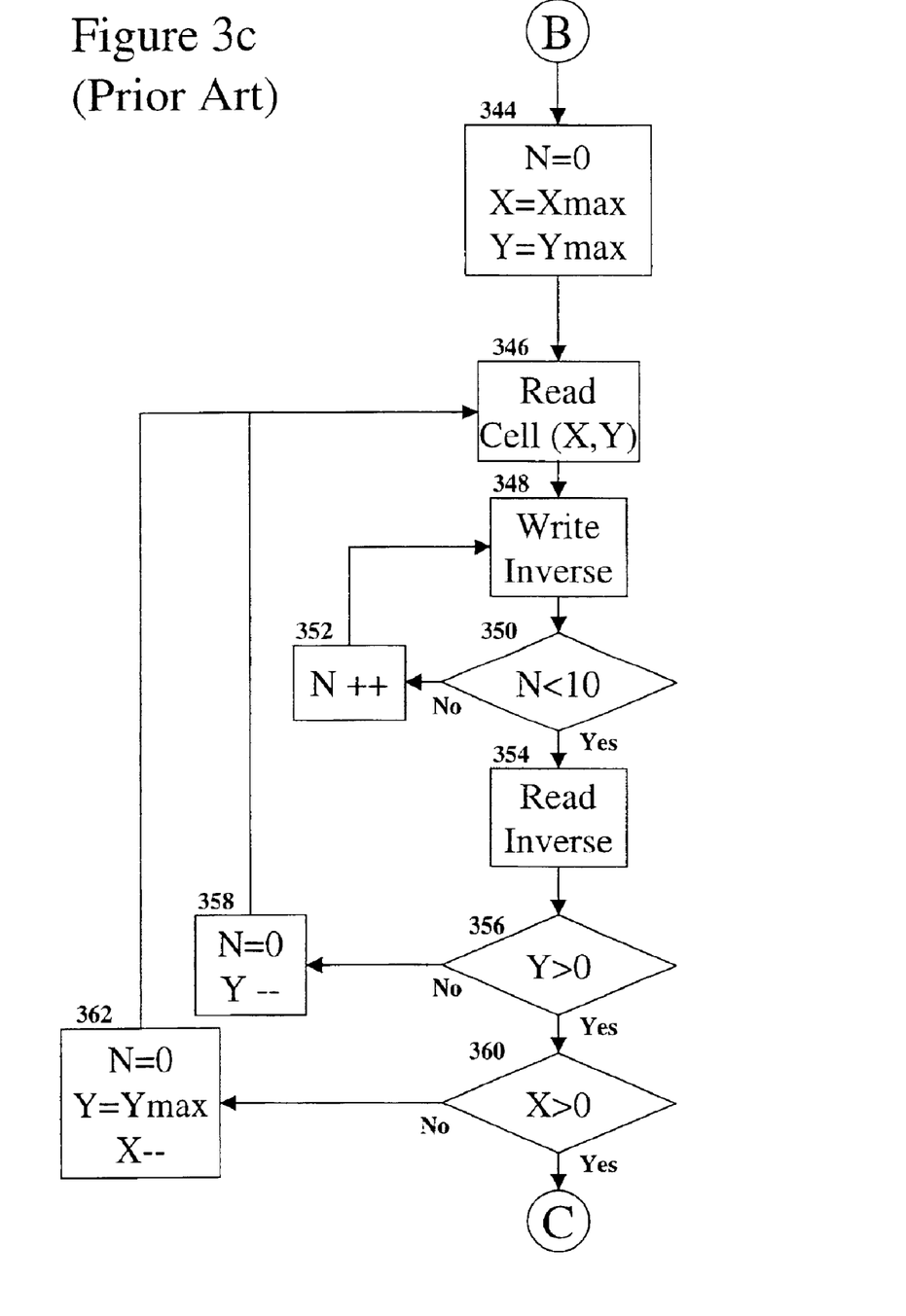
Figure 3D:
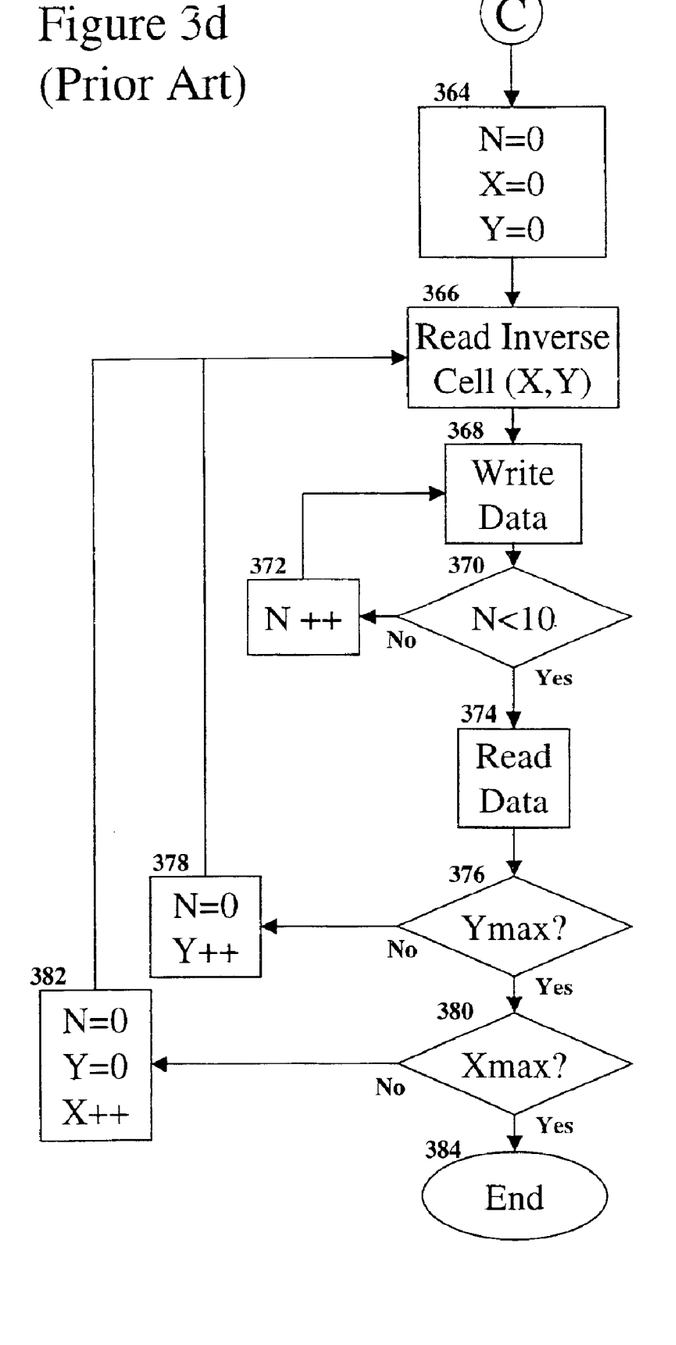

A second example of a test that is commonly performed is the Hammer 10 test, which isolates write recovery faults, illustrated in the flow chart of FIGS. 3a–d. As shown in FIG. 3a, the Hammer 10 test begins (Block 300) by writing a solid background of data to the cell being tested (Block 302). In one embodiment, a solid background of data is written by setting each bit at the memory address block to 0. The address block is set to the beginning X and Y coordinate, or (0,0), of the cell and a counter is set to 0 (Block 304). A read operation (Block 306), ten inverse write operations (Blocks 308, 310 and 312), and an inverse read operation (Block 314) are performed as the address coordinates are incremented until the maximum coordinates in the address block are reached. As illustrated in FIG. 3b, the address coordinates are set to zero for both the X and Y coordinates and the counter is reset to zero (Block 324). An inverse read operation (Block 326), ten write operations (Blocks 328, 330 and 332), and a read operation (Block 334) are performed as the address coordinates are incremented until the maximum coordinates in the address block are reached. As illustrated in FIG. 3c, the address coordinates are set at the maximum for both the X and Y coordinates and the counter is reset to zero (Block 344). A read operation (Block 346), ten inverse write operations (Blocks 348, 350 and 352), and an inverse read operation (Block 354) are performed as the address coordinates are decremented until the maximum coordinates in the address block are reached. As illustrated in FIG. 3d, the address coordinates are set to zero for both the X and Y coordinates and the counter is reset to zero (Block 364). An inverse read operation (Block 368), ten write operations (Blocks 368, 370 and 372), and a read operation (Block 374) are performed as the address coordinates are incremented until the maximum coordinates in the address block are reached, then the test is completed (Block 384).

Figure 4:
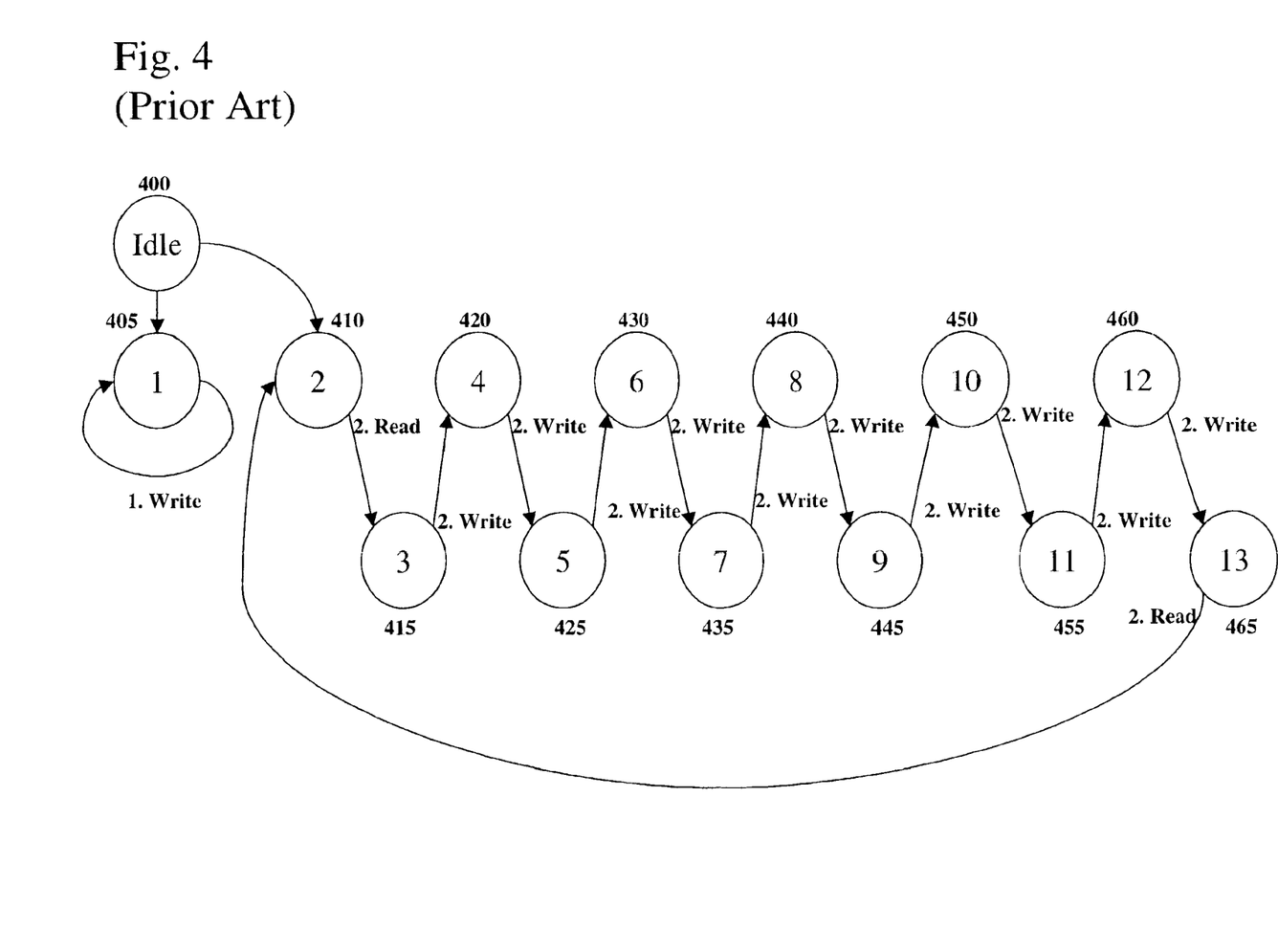
FIG. 4 is a block diagram of a state machine used to run the Hammer 10 RAM test.

A state machine to implement the Hammer 10 test is shown in the diagram of FIG. 4. The state machine includes an idle state (400) to which the state machine returns between test cycles and while tests are not being run. For the initial cycle in which a solid background is written, a first state (405) performs a looping write operation. With each write operation, the address is incremented until the entire memory cell has data written into it. For the second cycle, a second state (410) performs a read operation, in which data is read from an address, and then transitions to a third state (415) that performs a write operation, writing the inverted read data. Each of fourth state (420), fifth state (425), sixth state (430), seventh state (435), eighth state (440), ninth state (445), tenth state (450), eleventh state (455), and twelfth state (460) perform an additional write operation. The thirteenth state (465) performs a second read operation, at which the state machine transitions back to the second state (410). Again, the address is incremented after each cycle until the entire memory cell has had the cycle performed on it. For the third and fifth cycles, the same states as the second cycle are used, except that the first read operation is inverted, the repeated write operations are not inverted, and the final read operation is not inverted. The fourth cycle uses the same states as the second cycle, except that as the processing transitions back to the second state (410), the address is decremented back to the initial address.

As is shown by FIGS. 2 and 4, the state machines for even simple test suites like Mats++ and Hammer 10 quickly become complex. If a BIST was created to support all the various test suites, the state machine would be very complicated.

BRIEF DESCRIPTION OF THE DRAWINGS

The present invention is illustrated by way of example and not limitation in the figures of the accompanying drawings in which like references indicated similar elements and in which.

DETAILED DESCRIPTION

An integrated circuit and method are described for creating a built-in self-testing (BIST) state machine to test random access memories (RAMs). The BIST state machine is a four-state state machine that accommodates a large group of test suites by programming each state to have the capability of performing four operations. These operations include a write operation, a read operation, a read/write operation and a null operation. In alternative embodiments, further bits and signals can be added to the state machine to enable an even larger array of test suites to be performed.

In the following description, numerous details are set forth, such as distances between components, types of molding, etc. It will be apparent, however, to one skilled in the art, that the present invention may be practiced without these specific details. In other instances, well-known structures and devices are shown in block diagram form, rather than in detail, in order to avoid obscuring the present invention.

Figure 5A:
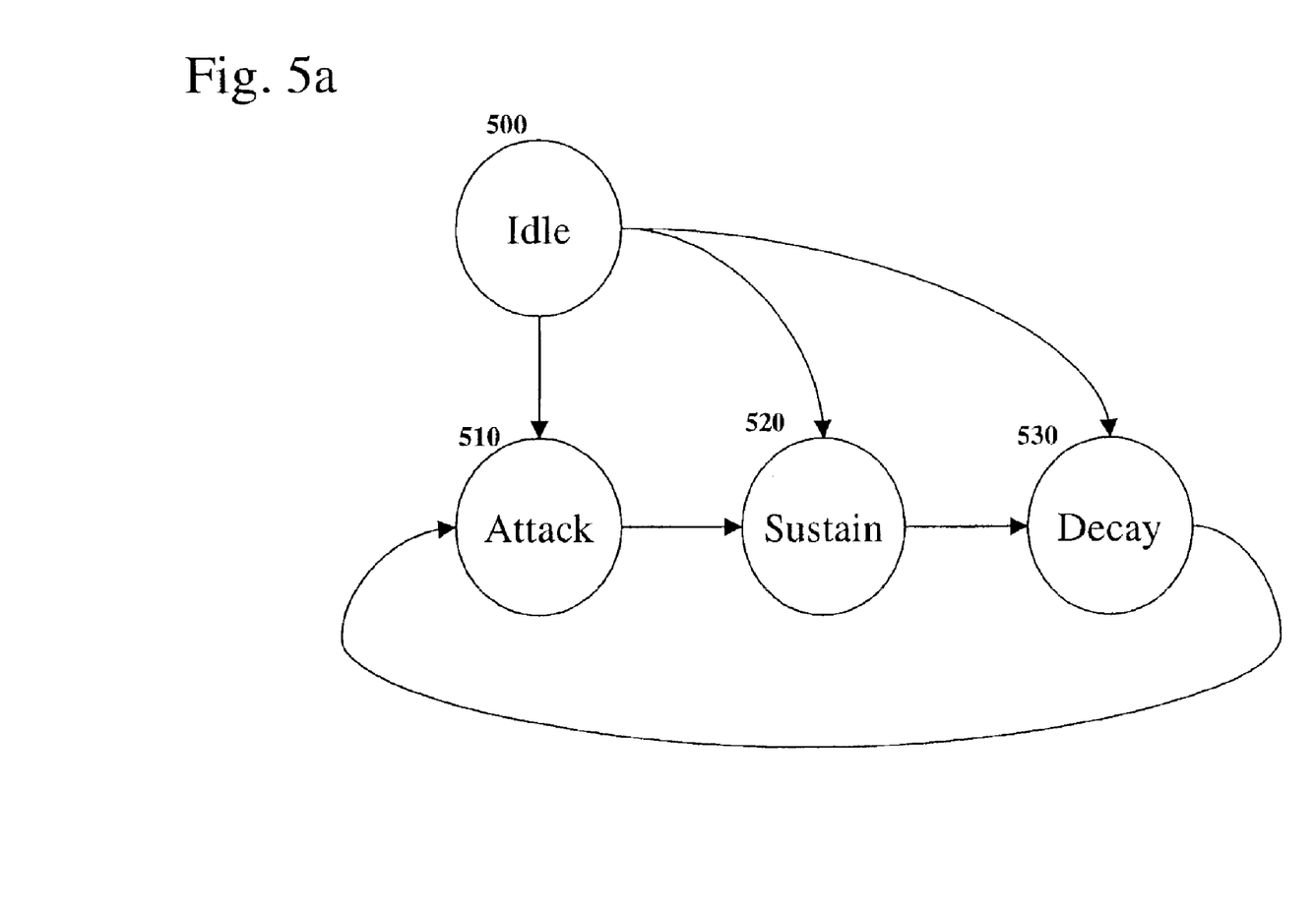
FIGS. 5a–b are block diagrams of a simplified BIST state machine.

One such state machine is the arrangement shown in FIG. 5a. Referring to FIG. 5a, an idle state (500) is used as a default state in between tests and test cycles. The initial state is an attack state (510), although in some embodiments the test suite or cycle does not necessarily begin with this state. A read operation in the attack state generally produces data already present at a memory address. The next state is a sustain state (520), which in some embodiments is used to maintain or lengthen a test cycle. A read operation in the sustain state generally produces data already present at a memory address for late-write RAMs and data newly written to that address for rising edge RAMs. The final state is a decay state (530), although in some embodiments the test suite or cycle ends prior to this state. A read operation in the decay state generally produces data newly written to a memory address. Most tests that perform operations to one address location at a time have no need to perform more than three consecutive operations. Most tests only require use of two of the three active states.

In one embodiment, each state is capable of performing at least four operations, including a write operation, a read operation, a read/write operation, and a null operation. In a read/write operation, the state performs a read operation and a write operation together. In one embodiment, the read, write, and read/write operations can invert the data. In one embodiment, the state machine supports both late-write and rising edge RAMs. In one embodiment, the state machine allows the full RAM width of unique write data to be written at one time or one 16-bit pattern to be written to the entire width, as opposed to each bit being written individually.

In one embodiment, states performing a null operation are skipped completely during the test cycle. In an alternate embodiment, if an enable counter bit is asserted, a sustain state is not skipped while performing a null operation. By not skipping a null operation at the sustain state, the enable counter bit creates a pause in operation execution, as required by some tests. In one embodiment, the counter allows the sustain state to perform the same operation a predefined number of times before transitioning to the next state. This includes the null operation if a pause is required during a cycle. The counter is used in tests such as Hammer 10, where multiple operations are performed at one address.

An address counter keeps track of the address that the state machine is testing. For multidimensional array tests, a nonlinear address counter is used. The address at which the state machine is performing the test cycle is incremented whenever a backward transition occurs. A backward transition includes a transition from the decay state to the attack state, the decay state to the sustain state, or from the sustain state to the attack state. In a further embodiment where two of the active states are skipped, the address is incremented when the state machine transitions to the same state, such as from the attack state to the attack state or from the decay state to the decay state. The address counter is checked for the last address in the last valid, or non-skipped, state. If the address is the last address to be tested, the state machine returns to the idle state. In one embodiment, when a test produces an error, the state machine returns to the idle state. By returning to the idle state, the address counter does not advance and the read data stays the same. The address of the failing cell is read from the address counter and the read data indicates which bit column failed. Failing addresses or failing bits within a row are captured in this manner. In one embodiment, an "address increment" bit specifies whether the address counter increments or decrements when the state machine forces the address counter to advance at the completion of a cycle. In a further embodiment, an "advance address on completion" bit causes the address counter to advance when the test completes, often leaving the address counter at the starting location for the next command.

Figure 5B:
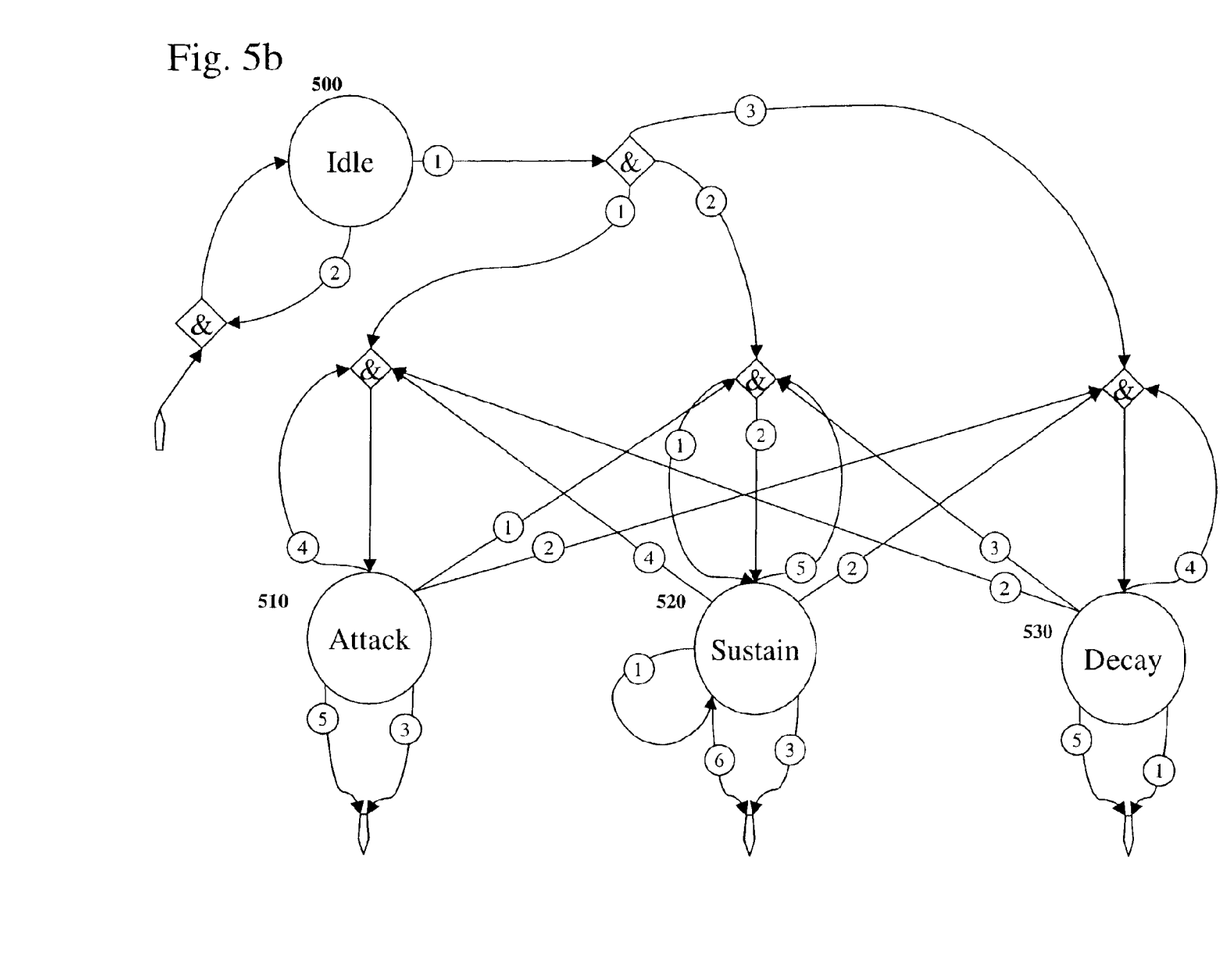

One embodiment of a RAM BIST state machine is illustrated in FIG. 5b. Such a state machine may be implemented in a chipset for use in a computer system. Referring to FIG. 5b, in the idle state (500), the BIST performs a first priority transition (arrow 1) to one of the other three states to perform a test operation, signaling either a read, a write, or a read-write operation. If the conditions for the first priority transition are not met, the BIST performs a second priority transition (arrow 2) back to the idle state (500) if no test is currently programmed or if an error has been detected.

In the attack state (510), the BIST performs a first priority transition (arrow 1) to a sustain state (520). A second priority transition (arrow 2) changes the BIST to a decay state (530). A third priority transition (arrow 3) changes the BIST to the idle state to indicate a completed test operation. A fourth priority transition (arrow 4) maintains the BIST in the attack state (510), incrementing the memory cell address in the process. A fifth priority transition (arrow 5) to the idle state indicates an error has been discovered.

In the sustain state (520), the BIST performs a first priority transition (arrow 1) maintains the BIST in the sustain state (520) without incrementing the memory cell address. A second priority transition (arrow 2) changes the BIST to the decay state (530). A third priority transition (arrow 3) changes the BIST to the idle state to indicate a completed test operation. A fourth priority transition (arrow 4) changes the BIST to the attack state (510), incrementing the memory cell address. A fifth priority transition (arrow 5) maintains the BIST in the sustain state (520), incrementing the memory cell address in the process. A sixth priority transition (arrow 6) to the idle state indicates an error has been discovered.

In the decay state (530), the BIST performs a first priority transition (arrow 1) to the idle state (500) to indicate a completed test operation. A second priority transition (arrow 2) changes the BIST to the attack state (520). A third priority transition (arrow 3) changes the BIST to the sustain state (530). A fourth priority transition (arrow 4) maintains the BIST in the decay state (530). A fifth priority transition (arrow 5) to the idle state indicates an error has been discovered. The second, third, and fourth priority transitions each increment the memory cell address.

Figure 6A:
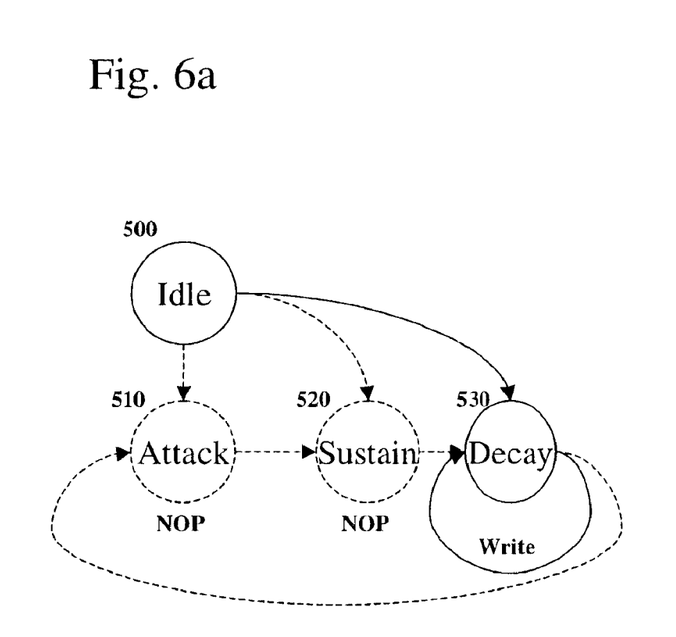
FIGS. 6a–c are block diagrams of one embodiment of a simplified BIST state machine running the Mats++ RAM test.
Figure 6B:
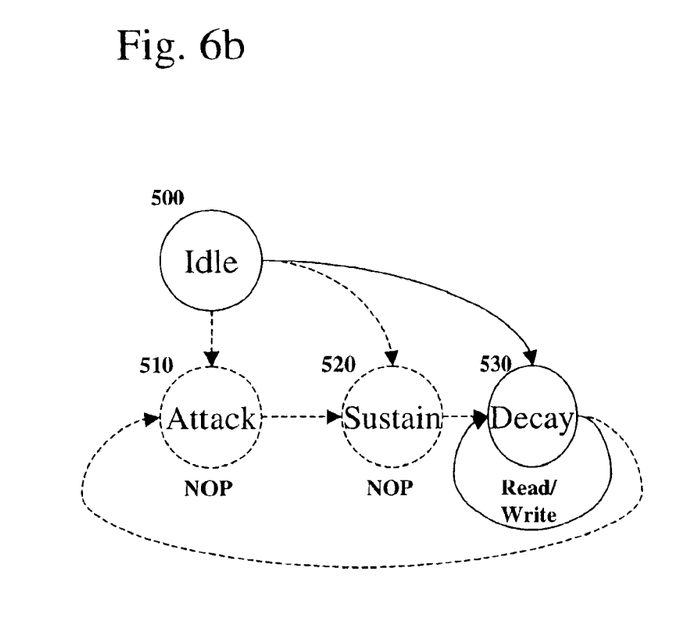
Figure 6C:
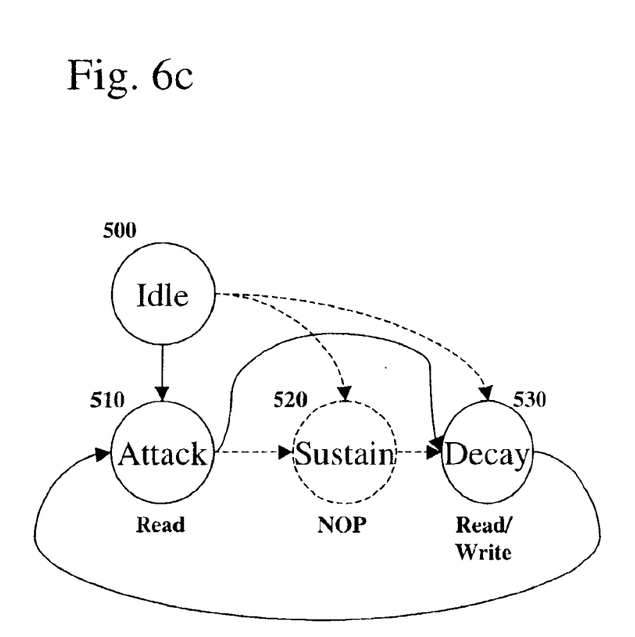
Figure 6D:
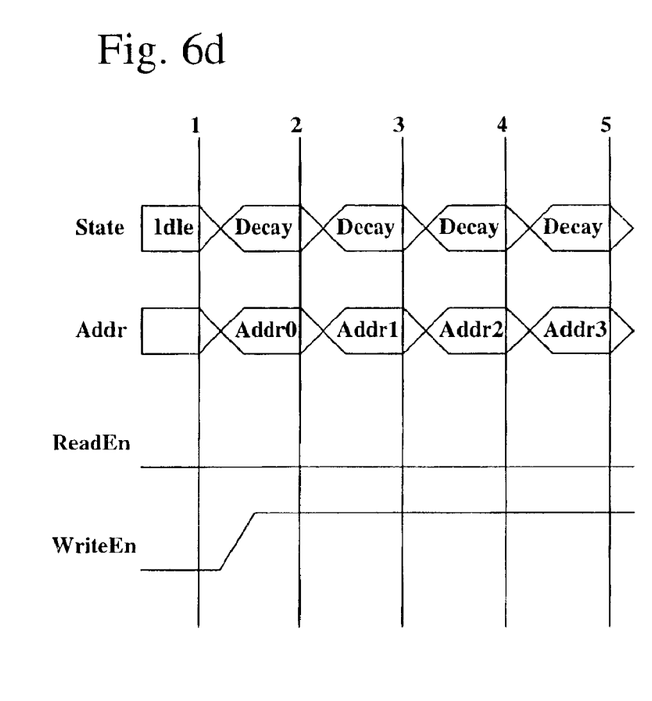
FIGS. 6d–f are timing diagrams of one embodiment of a BIST state machine running the Mats++ RAM test.
Figure 6E:
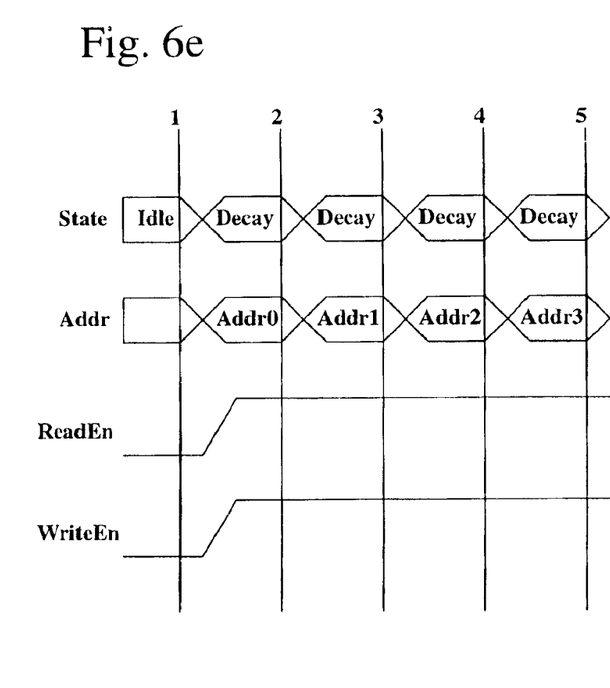
Figure 6F:
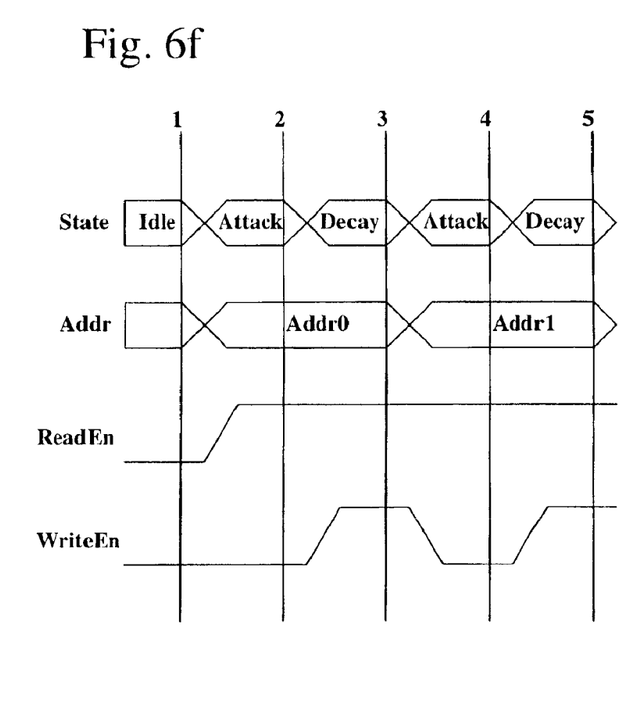

The new state machine can be applied to the Mats++ test described previously, as shown in the state machine diagrams of FIGS. 6a–c and the timing diagrams of FIGS. 6d–f. As shown in the state machine diagram of FIG. 6a and the timing diagram of FIG. 6d, a solid background is written to the cell to be tested by programming the state machine to remain in the decay state (530). In the decay state (530), a write operation is enabled. The attack state (510) and the sustain state (520) are programmed to perform null operations and are, therefore, skipped. At the conclusion of the first cycle, the state machine returns to the idle state (500).

The configuration for the second cycle is illustrated in the state machine diagram of FIG. 6b and the timing diagram of FIG. 6e. As with the first cycle, the attack state (510) and sustain state (520) are programmed to perform a null operation. The decay state (530) is programmed to perform a read/write operation and transition back to itself. At the completion of the second cycle, the state machine returns to the idle state (500).

The configuration for the final cycle of Mats++ is illustrated in the state machine diagram of FIG. 6c and the timing diagram of FIG. 6f. The sustain state (520) is programmed to perform a null operation. The state machine transitions from the idle state (500) to the attack state (510). In the attack state (510), a read operation is enabled. The attack state (510) transitions to the decay state (530). In the decay state (530), the read and write operations are enabled. The decay state (530) transitions back to the attack state (510), causing the address to be decremented. When the third cycle is completed, the decay state (530) transitions back to the idle state (500).

Figure 7A:
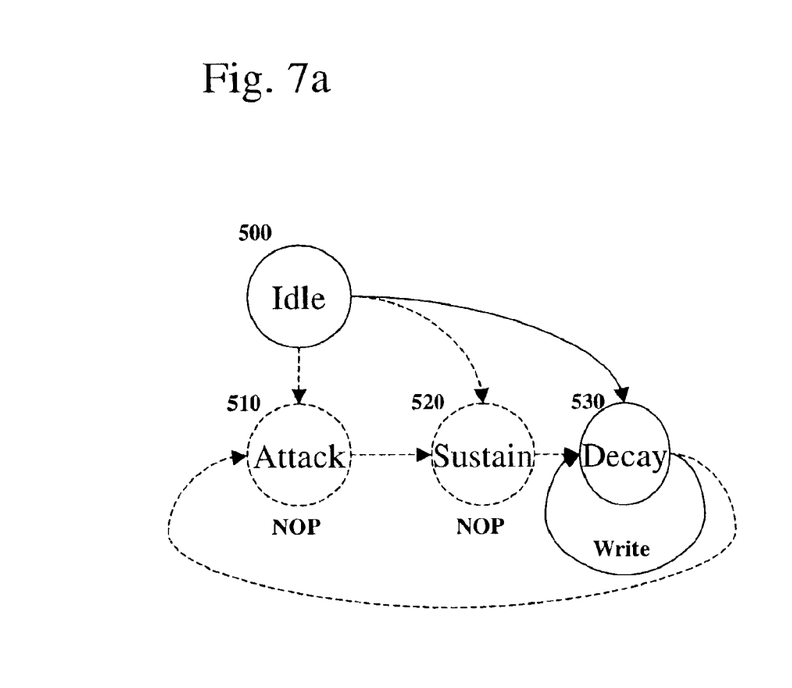
FIGS. 7a–b are block diagrams of one embodiment of a simplified BIST state machine running the Hammer 10 RAM test.
Figure 7B:
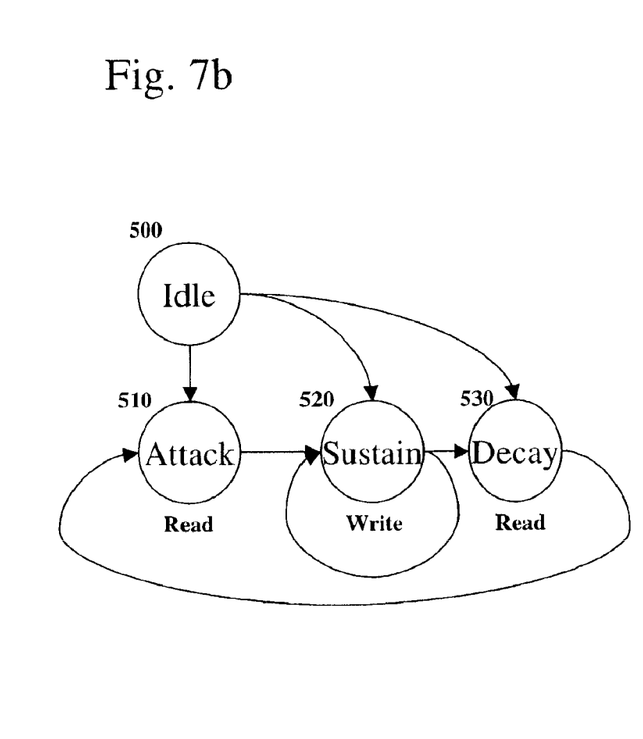

The new state machine can be applied to the Hammer 10 test described previously, as shown in the state machine diagrams of FIGS. 7a–b. As shown in the state machine diagram of FIG. 7a, a solid background is written to the cell to be tested by programming the state machine to remain in the decay state (530). In the decay state (530), a write operation is enabled. The attack state (510) and the sustain state (520) are programmed to perform null operations, and are therefore skipped. At the conclusion of the first cycle, the state machine returns to the idle state (500).

The configuration for the second through fifth cycles of Hammer 10 is illustrated in the state machine diagram of FIG. 7b. The state machine transitions from the idle state (500) to the attack state (510). In the attack state (510), a read operation is enabled. The attack state (510) transitions to the sustain state (520). The sustain state (520) is programmed to perform a looping write operation for nine increments of the counter. On the tenth write operation, the sustain state (520) transitions to the decay state (530). In the decay state (530), the read operation is enabled. The decay state (530) transitions back to the attack state (510), causing the address to be decremented. After each cycle is completed, the decay state (530) transitions back to the idle state (500).

The new state machine is able to perform tests in addition to the Hammer 10 and Mats++ tests, and is easily adaptable to future tests. These exemplary tests are only used as an illustration and should not be seen as limiting.

Further bits and counters can be added to accommodate other test suites. An "ignore error" bit allows the state machine to run to the end of the test even in the presence of an error. An "ignore last address" bit allows the state machine to run until the command register changes. This bit is useful for producing toggle coverage during extended burn-in testing. An "alternate address" bit supports back-to-back reads between a static address location and an incrementing address location provided by the address counter. This enables the state machine to perform the GALCOL test. A "data alternate" bit causes data to invert based on the least significant address bit to support checkerboard and row striped data patterns. Generics in the code, such as WIDTH, DEPTH, and INIT, allow the BIST state machine to be adjusted to fit the size and depth of a particular RAM. In a null operation, the state performs no operation.

The technique described above may be implemented as a set of instructions to be executed and stored in the memory of a computer system (e.g., set top box, video recorders, etc.). Instructions to perform the technique described above could alternatively be stored on other forms of machine-readable media, including magnetic and optical disks. For example, the method of the present invention could be stored on machine-readable media, such as magnetic disks or optical disks, which are accessible via a disk drive (or computer-readable medium drive). Further, the instructions can be downloaded into a computing device over a data network in a form of compiled and linked version. In this case, instructions are loaded through the JTAG port.

Alternatively, the logic to perform the methods as discussed above, could be implemented by additional computer and/or machine readable media, such as discrete hardware components as large-scale integrated circuits (LSI's), application-specific integrated circuits (ASIC's), firmware such as electrically erasable programmable read-only memory (EEPROM's); and electrical, optical, acoustical and other forms of propagated signals (e.g., carrier waves, infrared signals, digital signals, etc.); etc.

Although the present invention has been described with reference to specific exemplary embodiments, it will be evident that various modifications and changes may be made to these embodiments without departing from the broader spirit and scope of the invention. Accordingly, the specification and drawings are to be regarded in an illustrative rather than a restrictive sense.

What is claimed is:

1. An integrated circuit comprising a built-in self test (BIST) state machine, having:
    a plurality of states to conduct a plurality of tests for a random access memory (RAM), each state capable of performing a null operation, a write operation, a read operation, and a read/write operation;
    a command register coupled to the plurality of states to store test data for use with the plurality of states; and an address counter coupled to the plurality of states to determine a test location in the RAM.

2. The integrated circuit of claim 1, wherein the plurality of states consists of only four states to ensure that no more than four states are used by the BIST state machine for a test.

3. The integrated circuit of claim 1, wherein one of the plurality of states is an idle state to which the BIST state machine returns after a final address or an error is detected.

4. The integrated circuit of claim 1, wherein one state of the plurality of states assigned to perform the null operation is skipped during transitioning between the plurality of states.

5. The integrated circuit of claim 1, further comprising an additional counter to cause a state to repeat an assigned operation.

6. The integrated circuit of claim 1, wherein the address counter is incremented whenever a first state transitions to itself in a single state chain or to a second state positioned prior to the first state in a multiple state chain.

7. A method, comprising:
   feeding a test pattern to a command register in a built-in self testing (BIST) state machine;
   reading a test location in a random access memory (RAM) from an address counter; and
   applying the commands of the test pattern to the test location using a plurality of states, each of the plurality of states being configurable to perform a null operation, a write operation, a read operation, and a read/write operation.

8. The method of claim 7, wherein the plurality of states consists of only four states to ensure that no more than four states are used by the BIST state machine.

9. The method of claim 7, further comprising returning to an idle state after an error is detected or to which the BIST state machine returns after a final address is read.

10. The method of claim 7, further comprising repeating an assigned operation based on contents of a counter.

11. The method of claim 7, further comprising skipping a state assigned to perform a null operation.

12. The method of claim 7, further comprising incrementing an address counter whenever a first state transitions to itself in a single state chain or to a second state positioned prior to the first state in a multiple state chain.

13. The method of claim 7, further comprising signaling an address counter to increment or decrement addresses when advancing.

14. The method of claim 7, further comprising signaling to the BIST state machine to read from both a static address and the test location.

15. The method of claim 7, further comprising inverting data based on a least significant address bit.

16. A machine-readable storage medium tangibly embodying a sequence of instructions executable by the machine to perform a method comprising:
   feeding a test pattern to a command register in a built-in self testing (BIST) state machine;
   reading a test location in a random access memory (RAM) from an address counter; and
   applying the commands of the test pattern to the test location using a plurality of states, each of the plurality of states being configurable to perform a null operation, a write operation, a read operation, and a read/write operation.

17. The machine-readable storage medium of claim 16, wherein the plurality of states consists of only four states to ensure that no more than four states are used by the BIST state machine for a test.

18. The machine-readable storage medium of claim 16, further comprising returning to an idle state after an error is detected or to which the BIST state machine returns after a final address is read.

19. The machine-readable storage medium of claim 16, further comprising repeating an assigned operation based on contents of a counter.

20. The machine-readable storage medium of claim 16, further comprising skipping a state assigned to perform a null operation.

* * * * *